United States Patent
Sugiyama

(10) Patent No.: US 7,323,728 B2
(45) Date of Patent: Jan. 29, 2008

(54) SEMICONDUCTOR DEVICE

(75) Inventor: Toru Sugiyama, Kunitachi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 113 days.

(21) Appl. No.: 11/288,117

(22) Filed: Nov. 29, 2005

(65) Prior Publication Data

US 2006/0131608 A1    Jun. 22, 2006

(30) Foreign Application Priority Data

Nov. 30, 2004   (JP) .......................... P2004-346328

(51) Int. Cl.
     *H01L 29/76* (2006.01)
(52) U.S. Cl. ...................... 257/213; 257/197
(58) Field of Classification Search ................. 257/12, 257/64, 126, 154, 192, 194, 196–198, 213
     See application file for complete search history.

(56) References Cited

U.S. PATENT DOCUMENTS

| | | | | |
|---|---|---|---|---|
| 4,573,064 A * | 2/1986 | McLevige et al. | .......... | 257/198 |
| 5,073,812 A * | 12/1991 | Shimura | .......... | 257/587 |
| 5,250,826 A * | 10/1993 | Chang et al. | .......... | 257/273 |
| 5,404,373 A * | 4/1995 | Cheng | .......... | 372/50.124 |
| 5,455,440 A * | 10/1995 | Henderson et al. | .......... | 257/198 |
| 5,629,648 A | 5/1997 | Pratt | .......... | 330/289 |
| 5,764,674 A * | 6/1998 | Hibbs-Brenner et al. | .......... | 372/46.015 |
| 5,793,067 A * | 8/1998 | Miura et al. | .......... | 257/183 |
| 5,834,800 A * | 11/1998 | Jalali-Farahani et al. | ... | 257/198 |
| 6,043,519 A * | 3/2000 | Shealy et al. | .......... | 257/195 |
| 6,066,865 A * | 5/2000 | Cerny et al. | .......... | 257/194 |
| 6,403,991 B1 | 6/2002 | Kurokawa et al. | .......... | 257/197 |
| 6,566,694 B2 * | 5/2003 | Twynam | .......... | 257/197 |
| 6,573,540 B2 | 6/2003 | Kurokawa et al. | .......... | 257/197 |
| 6,639,257 B2 | 10/2003 | Kurokawa et al. | .......... | 257/197 |
| 6,743,691 B2 | 6/2004 | Kurokawa et al. | .......... | 438/312 |
| 6,803,643 B2 * | 10/2004 | Winslow | .......... | 257/572 |
| 6,897,547 B2 * | 5/2005 | Hayasi | .......... | 257/593 |
| 6,903,388 B2 * | 6/2005 | Murayama et al. | .......... | 257/197 |
| 7,038,250 B2 * | 5/2006 | Sugiyama et al. | .......... | 257/183 |
| 2003/0213973 A1 * | 11/2003 | Yoshioka et al. | .......... | 257/183 |
| 2003/0218185 A1 * | 11/2003 | Ohbu et al. | .......... | 257/197 |
| 2004/0188712 A1 * | 9/2004 | Lee et al. | .......... | 257/197 |

FOREIGN PATENT DOCUMENTS

JP    2001-127071    5/2001

* cited by examiner

*Primary Examiner*—Roy Karl Potter
(74) *Attorney, Agent, or Firm*—Oblon, Spivak, McClelland, Maier & Neustadt, P.C.

(57) ABSTRACT

Disclosed is a semiconductor device including an $n^+$-type semiconductor layer formed on a substrate, a first n-type semiconductor layer formed on the $n^+$-type semiconductor layer, a p-type semiconductor layer formed on the first n-type semiconductor layer and having a material having a first band gap, a second n-type semiconductor layer formed on the p-type semiconductor layer, being smaller than the p-type semiconductor layer in area and having a material having a second band gap larger than the first band gap, an implant portion formed to penetrate the p-type semiconductor layer, the first n-type semiconductor layer, and the $n^+$-type semiconductor layer in a region where the second n-type semiconductor layer is not formed and to divide these layers into two regions, and an electrode formed on a region of the p-type semiconductor layer where the second n-type semiconductor layer is not formed, so as to bridge over the implant portion.

20 Claims, 4 Drawing Sheets

SEMICONDUCTOR DEVICE

CROSS-REFERENCE TO RELATED APPLICATIONS

This application is based upon and claims the benefit of priority from the prior Japanese Patent Application Ser. No. 2004-346328, filed on Nov. 30, 2004; the entire contents of which are incorporated herein by reference.

BACKGROUND

1. Field of the Invention

The present invention relates to a semiconductor device, and particularly relates to a semiconductor device that is preferable for high frequency power application.

2. Description of the Related Art

For high frequency power application, such as power amplification at the final output stage of a cellular phone for example, an HBT (heterojunction bipolar transistor) having a heterojunction of InGaP/GaAs is used. Improvement in efficiency thereof as a power amplifier is important in a field such as cellular phones because it leads to extension of a possible talk time. In order to improve efficiency in a power amplifier using the HBT, it is effective to decrease so-called knee voltage (voltage between a collector and an emitter generated when collector current rising from zero changes to an almost constant value) among characteristics of the voltage between a collector and an emitter versus collector current of the HBT. Generally, the knee voltage can be reduced by decreasing emitter resistance and collector resistance.

Particularly, regarding devices for power application, there are many cases where a plurality of elements formed on a semiconductor substrate are connected in parallel to be used as one device, and in such cases, thermal runaway easily occurs when the emitter resistance is reduced. Thermal runaway is a phenomenon such that when a temperature increases by heat generated by a device or the like, current begins to concentrate in an element having a slightly higher temperature, and thus the element further generates heat and current concentrates more therein, thereby leading to failure or destruction.

In order to suppress the thermal runaway, a structure that inserts resistance (ballast resistance) in a base of each element is effective, but on the other hand, the inserted resistance causes deterioration of frequency characteristics. Techniques for achieving a balance between acquisition of frequency characteristics and suppression of thermal runaway include, for example, one described in Patent document 1 listed below. In this technique, an electrode for inputting an RF signal to a base and an electrode for applying bias voltage thereto are provided separately, thereby allowing a base layer extension portion, extending from the electrode for applying bias to a base layer, to function as the ballast resistance. This configuration increases a capacity between a base and a collector by extension of the base layer, and thus it is conceivable that acquisition of further frequency characteristics is difficult.

[Patent document 1] Japanese Patent Laid-open Application No. 2001-127071

SUMMARY

A semiconductor device according to one aspect of the present invention includes a semiconductor substrate, an $n^+$-type semiconductor layer formed on the semiconductor substrate, a first n-type semiconductor layer formed on the $n^+$-type semiconductor layer, a p-type semiconductor layer formed on the first n-type semiconductor layer and having a material having a first band gap, a second n-type semiconductor layer formed on the p-type semiconductor layer, the second n-type semiconductor being smaller than the p-type semiconductor layer in area and having a material having a second band gap larger than the first band gap, an implant portion formed to penetrate, from a region of the p-type semiconductor layer where the second n-type semiconductor layer is not formed, the first n-type semiconductor layer and the $n^+$-type semiconductor layer to reach the semiconductor substrate, the implant portion dividing the p-type semiconductor layer, the first n-type semiconductor layer and the $n^+$-type semiconductor layer into two regions, and an electrode formed on a region of the p-type semiconductor layer where the second n-type semiconductor layer is not formed, so as to bridge over at least the implant portion.

A semiconductor device according to another aspect of the present invention includes a plurality of semiconductor elements each having a semiconductor substrate, an $n^+$-type semiconductor layer formed on the semiconductor substrate, a first n-type semiconductor layer formed on the $n^+$-type semiconductor layer, a p-type semiconductor layer formed on the first n-type semiconductor layer and having a material having a first band gap, a second n-type semiconductor layer formed on the p-type semiconductor layer, the second n-type semiconductor layer being smaller than the p-type semiconductor layer in area and having a material having a second band gap larger than the first band gap, an implant portion formed to penetrate, from a region of the p-type semiconductor layer where the second n-type semiconductor layer is not formed, the first n-type semiconductor layer and the $n^+$-type semiconductor layer to reach the semiconductor substrate, the implant portion dividing the p-type semiconductor layer, the first n-type semiconductor layer and the $n^+$-type semiconductor layer into two regions, and an electrode formed on a region of the p-type semiconductor layer where the second n-type semiconductor layer is not formed, so as to bridge over at least the implant portion, and an element isolating film provided to electrically isolate at least the $n^+$-type semiconductor layer of each of the plurality of semiconductor elements from others.

DETAILED DESCRIPTION (Description of Embodiments)

Embodiments of the present invention will be described with reference to the drawings, but these drawings are provided only for an illustrative purpose, and in no way limit the invention.

In a semiconductor device according to one mode of the present invention, a p-type semiconductor layer is divided, together with a first n-type semiconductor layer and an n+-type semiconductor layer, into two regions by an implant portion. Then, an electrode is formed on a region of the p-type semiconductor layer where the second n-type semiconductor layer is not formed, so as to bridge over at least the implant portion. With such a structure, one region of the p-type semiconductor layer can be made as a region being ballast resistance, and moreover, a junction between the p-type semiconductor layer in this region and the n-type semiconductor layer therebelow is separated from an active region by the implant portion, thereby preventing the junction from becoming a capacity between a base and a collector as a transistor. Therefore, both suppression of thermal runaway and acquisition of further frequency characteristics can be achieved.

As a form of an embodiment of the present invention, the electrode may have a shape narrowed at a portion bridging over the implant portion in a plan view. This is for reducing, as much as possible, the amount of capacity formed parasitically by the electrode and the n+-type semiconductor layer. This further reduces the capacity between a base and a collector and thus is preferable.

Further, as a form, the material having the first band gap of the p-type semiconductor layer may be constituted mainly of GaAs or GaAsSb. Also, the material having the second band gap of the second n-type semiconductor layer may be constituted mainly of InGaP. It is an example of realizing a heterojunction of HBT.

Further, as a form, the electrode may be formed to extend to the other side of the implant portion with the second n-type semiconductor layer intervening therebetween, and have a signal input connection part on the other side. It is to have connection for RF input on the opposite side of the implant portion. This simplifies a layout in the case of including a coupling capacitor.

Also, as a form, the p-type semiconductor layer may be formed with a thickness of approximately 50 nm. It is for adaptation to high frequency application.

Figure 1:
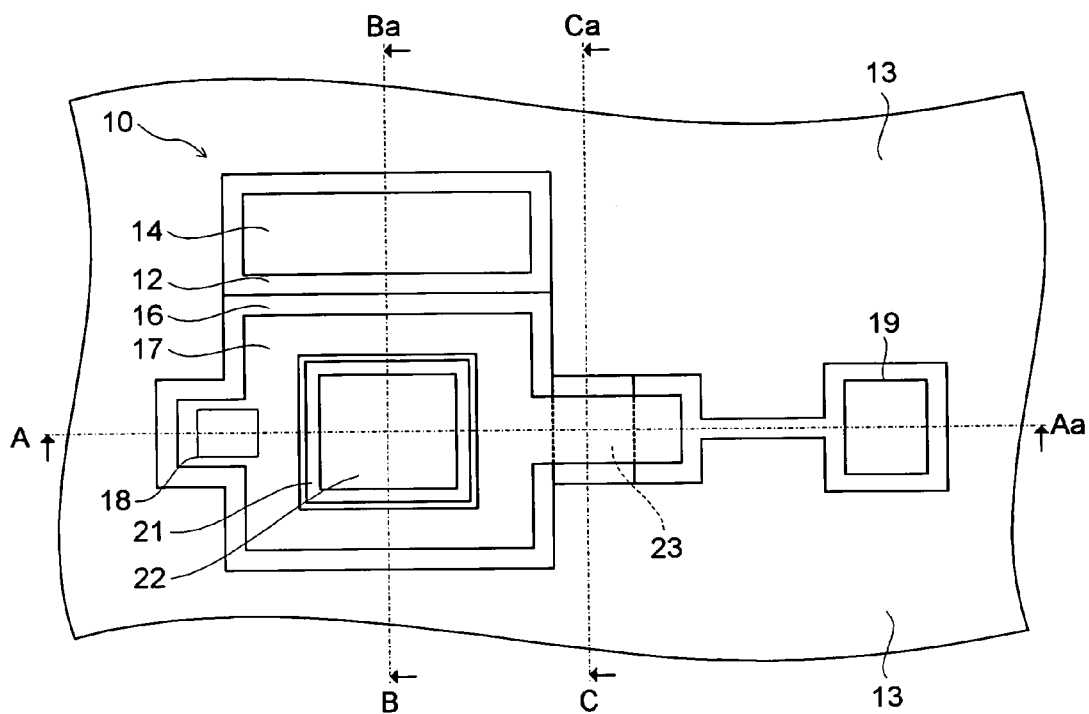
FIG. 1 is a plan view showing a schematic structure of a semiconductor device (HBT) according to an embodiment of the present invention.

In view of the foregoing, embodiments of the present invention will be described below with reference to the drawings. FIG. 1 is a plan view showing a schematic structure of a semiconductor device (HBT) according to an embodiment of the present invention. As shown in FIG. 1, this HBT 10 is formed to be isolated as an element from other regions by an element isolation film 13 and has an n+-GaAs layer (n+-type semiconductor layer) 12, a collector electrode 14, p+-GaAs layer (p-type semiconductor layer) 16, a base electrode 17, a signal input connection part (RF input port) 18, a direct current input electrode (DC input port) 19, an n-GaAs layer 21, an emitter electrode 22, and an implant portion 23.

Figure 2:
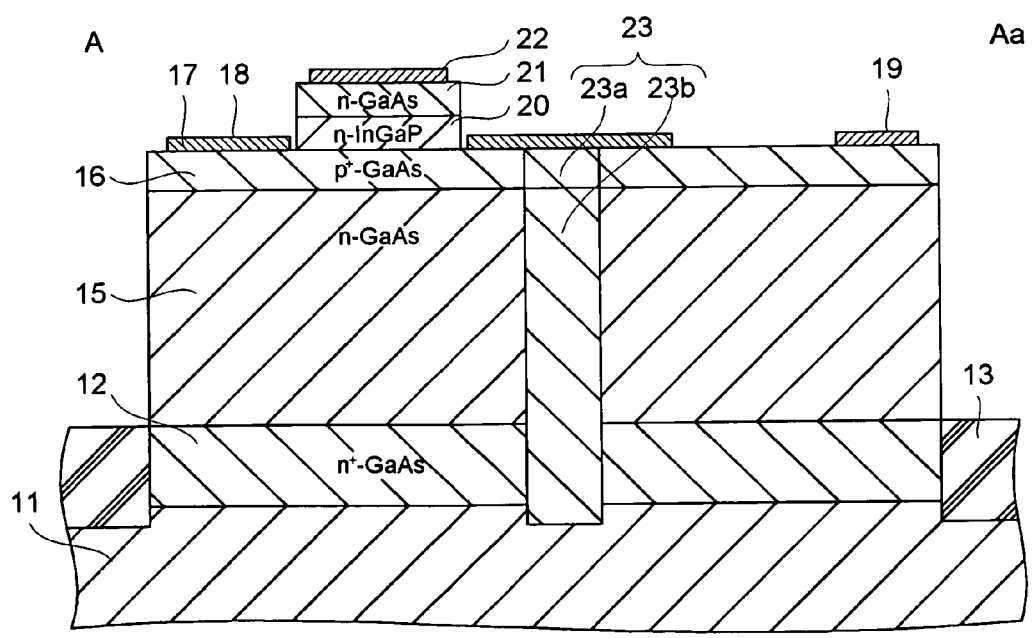
FIG. 2 is a schematic cross-sectional view taken along a line A-Aa shown in FIG. 1 in a viewing direction indicated by arrows.

FIG. 2 is a schematic cross-sectional view taken along a line A-Aa shown in FIG. 1 in a viewing direction indicated by arrows. This HBT further has, other than the components shown in FIG. 1, an insulative (semi-insulative) semiconductor substrate (GaAs substrate) 11, an n-GaAs layer (first n-type semiconductor layer) 15, and an n-InGaP layer (second n-type semiconductor layer) 20, which overlap in the vertical direction. The implant portion 23 shown is divided, for convenience, into an implant portion 23a in the p+-GaAs layer 16 and an implant portion 23b in the n-GaAs layer and the n+-GaAs layer.

Figure 3:
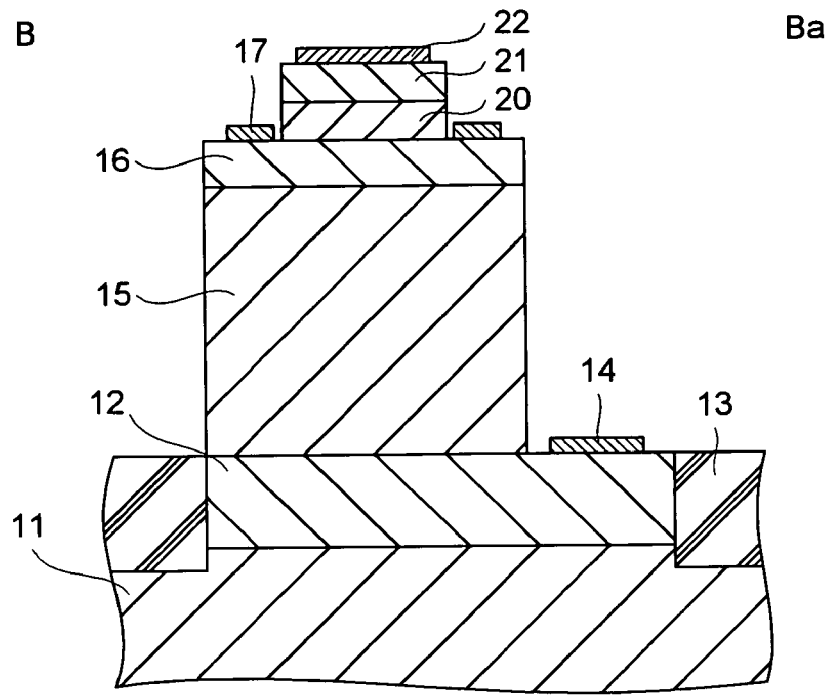
FIG. 3 is a schematic cross-sectional view taken along a line B-Ba shown in FIG. 1 in a viewing direction indicated by arrows.
Figure 4:
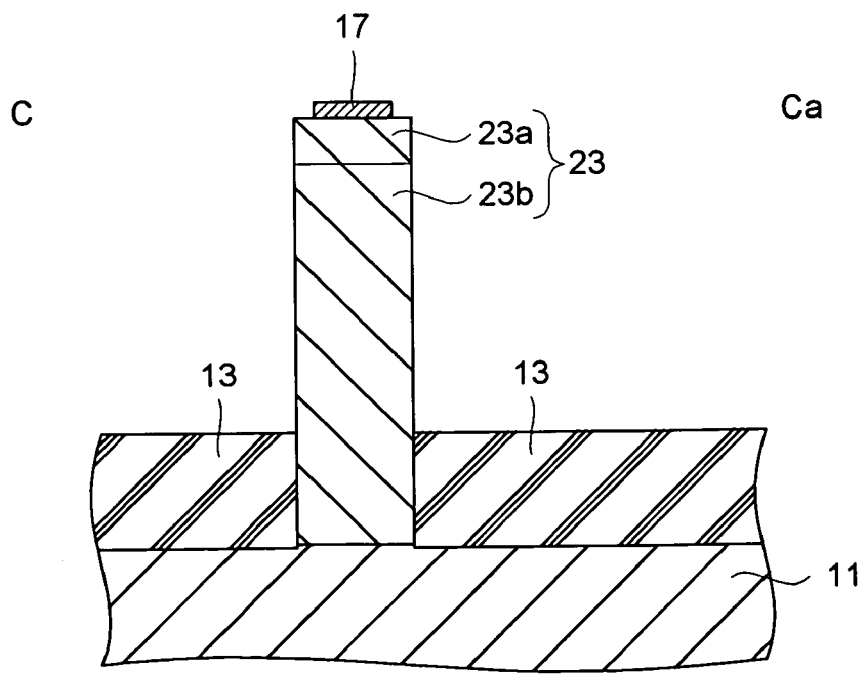
FIG. 4 is a schematic cross-sectional view taken along a line C-Ca shown in FIG. 1 in a viewing direction indicated by arrows.

FIG. 3 is a schematic cross-sectional view taken along a line B-Ba shown in FIG. 1 in a viewing direction indicated by arrows. FIG. 4 is a schematic cross-sectional view taken along a line C-Ca shown in FIG. 1 in a viewing direction indicated by arrows. Numerals and symbols used in FIG. 3 and FIG. 4 are common to those in FIG. 1 and FIG. 2.

As shown in FIG. 1 to FIG. 4, this HBT 10 has the collector electrode 14 on a part of the n+-GaAs layer 12 (with a thickness of 500 nm for example) formed on the semiconductor substrate 11. On a region on the n+-GaAs layer 12 where the collector electrode 14 does not exist, the n-GaAs layer 15 (with a thickness of 700 nm for example) is formed in a stacked manner excluding the vicinity of the collector electrode 14, and on the n-GaAs layer 15, the p+-GaAs layer 16 (with a thickness of 50 nm for example) is formed in a stacked manner. Moreover, on a part of the p+-GaAs layer 16, the n-InGaP layer 20 (with a thickness of 20 nm for example) is formed in a stacked manner, and on the n-InGaP layer 20, the n-GaAs layer 21 (with a thickness of 100 nm for example) is formed in a stacked manner. On the n-GaAs layer 21, the emitter electrode 22 is formed in a stacked manner.

The p+-GaAs layer 16, the n-GaAs layer 15, and the n+-GaAs layer 12 are separated into two regions by the implant portion 23 formed to reach the semiconductor substrate 11, and a side having the n-InGaP layer 20 and the n-GaAs layer 21 shown on the left side in the drawing is a region that functions as an actual transistor (=active region). Here, the n+-GaAs layer 12, the n-GaAs layer 15, the p+-GaAs layer 16, the n-InGaP layer 20, and the n-GaAs layer 21 function as a collector contact layer, a collector layer, a base layer, an emitter layer, and an emitter contact layer, respectively. A junction between the p+-GaAs layer 16 as the base layer and the n-InGaP layer 20 as the emitter layer is a heterojunction.

The base electrode 17 is formed on a region on the p+-GaAs layer 16 where the n-InGaP layer 20 is not formed and, more particularly, formed so as to surround the n-InGaP layer 20 and bridge over the implant portion 23. A part of the base electrode 17 on the opposite side of a side where the implant portion 23 is formed with the emitter electrode 22 intervening therebetween is the signal input connection part 18. The direct current input electrode 19 is provided in the vicinity of an edge portion, which is separated from the implant portion 23, of the p+-GaAs layer 16 divided by the implant portion 23.

Impurity doping concentrations in respective layers are, for example, $5 \times 10^{18}$ cm$^{-3}$ in the n+-GaAs layer 12, $1 \times 10^{16}$ cm$^{-3}$ in the n-GaAs layer 15, $4 \times 10^{19}$ cm$^{-3}$ in the p+-GaAs layer 16, $4 \times 10^{17}$ cm$^{-3}$ in the n-InGaP layer 20, and $5 \times 10^{18}$ cm$^{-3}$ in the n-GaAs layer 21. The implant portion 23 is a portion such that, after the n+-GaAs layer 12, the n-GaAs layer 15, and the p+-GaAs layer 16 are formed in a stacked manner, an ion implantation is performed from an upper side of the p+-GaAs layer 16 to reach the semiconductor substrate 11 to thereby increase resistance in these layers. One kind, or two kinds or more of a boron ion, an oxygen ion, a hydrogen ion, a helium ion, and the like, for example, may be implanted in a portion corresponding to the implant portion 23. The implant portion 23a in the p+-GaAs layer 16 has a low resistance value as compared to the other implant portion 23b because an impurity concentration therein is originally high.

Regarding sizes in a plan view of respective portions, the p$^+$-GaAs layer 16 is 5 μm long in the longitudinal direction at the maximum for example, and the p$^+$-GaAs layer 16 in the active region is 20 μm wide in the latitudinal direction at the maximum for example. The base electrode 17 is 4 μm long in the longitudinal direction at the maximum for example, and the emitter electrode 22 is 2 μm long in the longitudinal direction for example.

A portion of the p$^+$-GaAs layer 16 extending from immediately under the direct current input electrode 19 to the base electrode 17 formed to bridge over the implant portion 23 to extend to the direct current input electrode 19 side, and the implant portion 23a in the p$^+$-GaAs layer 16 are portions which function as resistance inserted into the base. However, between them, the implant portion 23a in the p$^+$-GaAs layer 16 contributes less as the resistance because the base electrode 17 exists in parallel.

A value as the base resistance can be designed to be a necessary value by controlling the impurity concentration and the shape, such as length, width and thickness, of these portions of the p$^+$-GaAs layer 16. As a specific example of the necessary value is, for example, around 1 kΩ. These portions as the base resistance have a pn junction with the n-GaAs layer 15, but it is a pn junction with the n-GaAs layer 15 region that is divided by the implant portion 23 and hence inactive, which does not cause increase in the capacity between a collector and an base. Therefore, there is no possibility of deteriorating high frequency characteristics.

When this HBT 10 is used in a power amplifier at the final output stage of a cellular phone, operating conditions may be set such that, for example, power supply voltage Vcc =3.5 V, collector current Ic =5 mA, and a frequency band (upper limit) f =800 MHz to 5 GHz. In this case, practically, a plurality (50 to 100 for example) of HBTs 10 are fabricated on a same semiconductor chip, and these are connected in parallel and used as a device having a high frequency, high current, and high output (1W to 3W for example).

Figure 5:
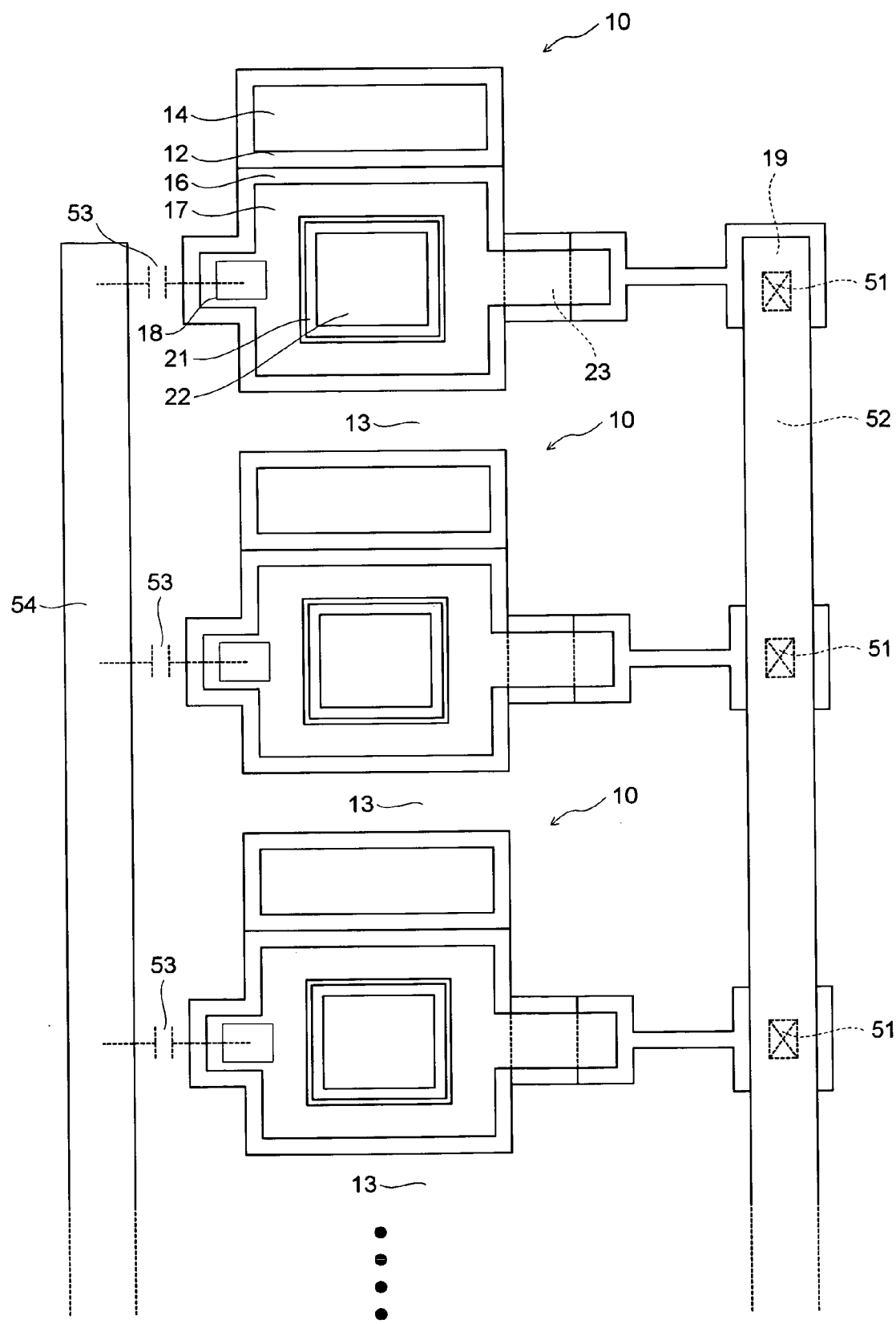
FIG. 5 is an illustrative schematic layout diagram of the case of using a plurality of semiconductor devices shown in FIG. 1 in parallel.

FIG. 5 describes such a mode and is an illustrative schematic layout diagram of the case of using a plurality of semiconductor devices (HBTs 10) shown in FIG. 1 in parallel. In FIG. 5, the same and equivalent parts as those already described are designated by the same numerals. As shown in FIG. 5, the respective HBTs 10 are arranged so that latitudinal directions of the respective p$^+$-GaAs layers 16 are parallel to each other and lines connecting the emitter electrodes 22 and the collector electrodes 14 are aligned straight. The respective direct current input electrodes 19 can be electrically connected by a wire 52 via respective contacts 51. By the wire 52, the same direct current voltage is supplied to each direct current input electrode 19.

Further, to the signal input connection part 18 of each base electrode 17, provided on the opposite side of the implant portion 23 side with the emitter electrode 22 intervening therebetween, a wire 54 is arranged and connected via a capacitor (coupling capacitor) 53. The capacitor 53 can be fabricated on a same chip with the HBT 10 by a known structure. A signal whose power should be amplified is supplied to each base electrode 17 via each capacitor 53 by the wire 54. Note that, although it poses slight difficulty in layout to acquire a region for fabricating the capacitors 53, it is possible to arrange the wire 54 on the opposite side of its location shown in the drawing with the emitter electrode 22 intervening therebetween.

As has been described, in the semiconductor device (HBT 10) of the embodiment, the p$^+$-GaAs layer 16 is divided, together with the n-GaAs layer 15 and n$^+$-GaAs layer 12, into two regions by the implant portion 23. Then, the base electrode 17 is formed on a region of the p$^+$-GaAs layer 16 where the n-InGaP layer 20 is not formed, so as to bridge over at least the implant portion 23. With such a structure, one region of the p$^+$-GaAs layer 16 can be made as a region being ballast resistance, and moreover, the junction between the p$^+$-GaAs layer 16 in this region and the n-GaAs layer 15 there below is separated from an active region by the implant portion 23, thereby preventing it from increasing a capacity between a base and a collector as a transistor. Therefore, both suppression of thermal runaway and acquisition of further frequency characteristics can be achieved.

Figure 6:
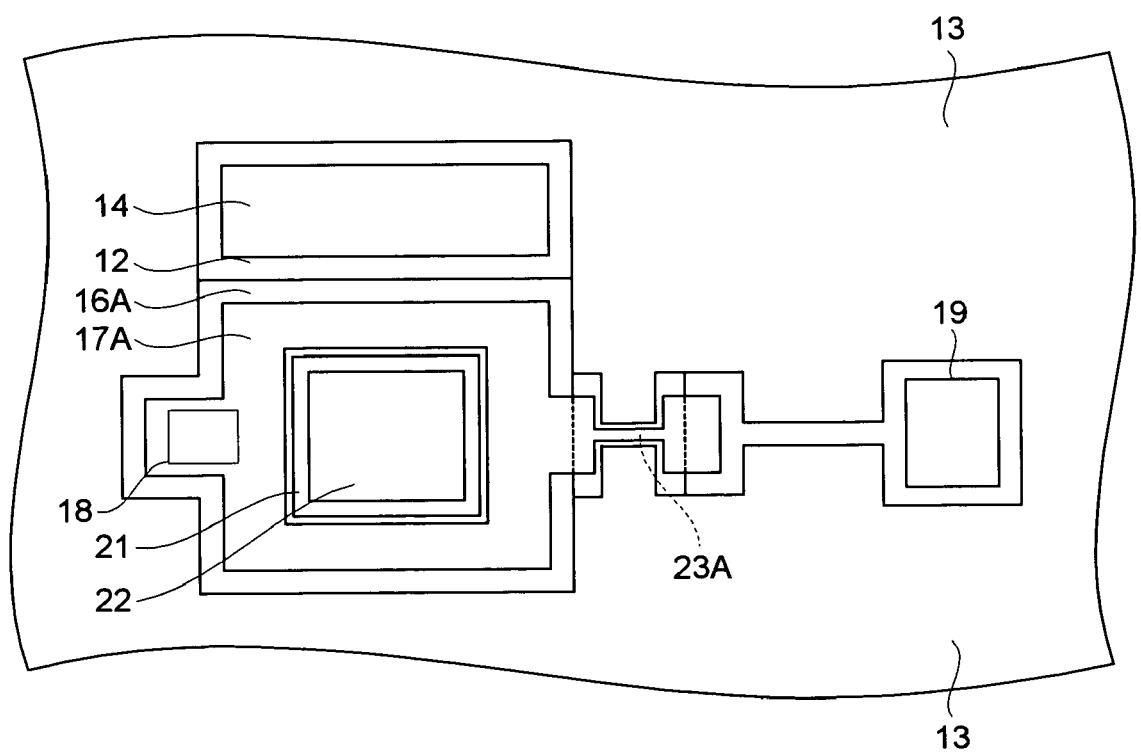
FIG. 6 is a plan view showing a schematic structure of a semiconductor device (HBT) according to another embodiment of the present invention.

Next, a semiconductor device (HBT) according to another embodiment of the present invention will be described with reference to FIG. 6. FIG. 6 is a plan view showing a schematic structure of the semiconductor device (HBT) according to another embodiment of the present invention. In FIG. 6, the already described parts are designated by the same numerals and symbols, and descriptions thereof are omitted. Furthermore, drawings of cross-sectional views equivalent to FIG. 2 to FIG. 4 are omitted because they are obvious from the plan view shown in FIG. 6.

In this embodiment, at a region where an implant portion 23A is formed, a p$^+$-GaAs layer 16A and a base electrode 17A are narrowed in a plan view. The other parts are the same as those in the above-described embodiment. By forming the p$^+$-GaAs layer 16A and the base electrode 17A in such a shape, an opposing area (although opposing slightly obliquely) of the base electrode 17A against the n$^+$-GaAs layer 12 being a collector contact layer can be decreased. Therefore, the capacity between a base and a collector can be reduced as compared to the case of the above-described embodiment. Consequently, further improvement in high frequency characteristics can be expected.

This embodiment is obtained in light of the fact that, while a contact area between the p$^+$-GaAs layer 16A and the base electrode 17A should be acquired to a certain degree on both sides across the implant portion 23 for enabling electrical conduction of the p$^+$-GaAs layer 16A divided in two, the contact area may be small on the implant portion 23A.

It should be noted that, in the above embodiments, the cases of HBT having the p$^+$-GaAs layers 16 and 16A as the p-type semiconductor layer (base layer) are shown, but besides these, it is possible to use p$^+$-GaAsSb as the base layer.

It is appreciated that the present invention is not limited to any specific embodiment illustratively described herein, but includes all modifications which come within the scope of the following claims.

What is claimed is:

1. A semiconductor device, comprising:
   a semiconductor substrate;
   an n$^+$-type semiconductor layer formed on the semiconductor substrate;
   a first n-type semiconductor layer formed on the n$^+$-type semiconductor layer;
   a p-type semiconductor layer formed on the first n-type semiconductor layer and having a material having a first band gap;
   a second n-type semiconductor layer formed on the p-type semiconductor layer, the second n-type semiconductor layer being smaller than the p-type semiconductor layer in area and having a material having a second band gap larger than the first band gap;

an implant portion formed to penetrate, from a region of the p-type semiconductor layer where the second n-type semiconductor layer is not formed, the first n-type semiconductor layer and the n⁺-type semiconductor layer to reach the semiconductor substrate, the implant portion dividing the p-type semiconductor layer, the first n-type semiconductor layer, and the n⁺-type semiconductor layer into two regions, one region of the two regions being an active region on which the second n-type semiconductor layer exists, another region of the two regions being a non-active region on which the second n-type semiconductor layer does not exist, the active region configured to accept an RF signal, the non-active region configured to accept a DC voltage; and an electrode formed on a region of the p-type semiconductor layer where the second n-type semiconductor layer is not formed, so as to bridge over at least the implant portion and to be in contact with both of the p-type semiconductor layer of the active region and the p-type semiconductor layer of the non-active region.

2. The semiconductor device as set forth in claim 1, wherein the electrode has a narrowed portion in a plane view, an entire length of the narrowed portion being formed on the implant portion.

3. The semiconductor device as set forth in claim 1, wherein the material having the first band gap of the p-type semiconductor layer is constituted mainly of gallium arsenide (GaAs).

4. The semiconductor device as set forth in claim 1, wherein the material having the first band gap of the p-type semiconductor layer is constituted mainly of gallium arsenide antimonide (GaAsSb).

5. The semiconductor device as set forth in claim 1, wherein the material having the second band gap of the second n-type semiconductor layer is constituted mainly of indium gallium phosphide (InGaP).

6. The semiconductor device as set forth in claim 1, wherein the electrode is formed to extend to an opposite side from the implant portion with the second n-type semiconductor layer, and has a signal input connection part accepting the RF signal on the opposite side.

7. The semiconductor device as set forth in claim 1, wherein the implant portion has ions of one kind, or two kinds or more selected from a group consisting of a boron ion, an oxygen ion, a hydrogen ion, and a helium ion.

8. The semiconductor device as set forth in claim 1, wherein the first n-type semiconductor layer is formed on a part of the n⁺-type semiconductor layer, and further comprising a second electrode formed on a region of the n⁺-type semiconductor layer where the first n-type semiconductor layer is not formed.

9. The semiconductor device as set forth in claim 1, further comprising:

a third n-type semiconductor layer formed on the second n-type semiconductor layer and having a higher impurity concentration than an impurity concentration in the second n-type semiconductor layer.

10. A semiconductor device, comprising:
a plurality of semiconductor elements each including
a semiconductor substrate,
an n⁺-type semiconductor layer formed on the semiconductor substrate,
a first n-type semiconductor layer formed on the n⁺-type semiconductor layer, a p-type semiconductor layer formed on the first n-type semiconductor layer and having a material having a first band gap, a second n-type semiconductor layer formed on the p-type semiconductor layer, the second n-type semiconductor layer being smaller than the p-type semiconductor layer in area and having a material having a second band gap larger than the first band gap, an implant portion formed to penetrate, from a region of the p-type semiconductor layer where the second n-type semiconductor layer is not formed, the first n-type semiconductor layer and the n⁺-type semiconductor layer to reach the semiconductor substrate, the implant portion dividing the p-type semiconductor layer, the first n-type semiconductor layer, and the n⁺-type semiconductor layer into two regions, one region of the two regions being an active region on which the second n-type semiconductor layer exists, another region of the two regions being a non-active region on which the second n-type semiconductor layer does not exist, the active region being capable of accepting an RF signal, the non-active region being capable of accepting a DC voltage, and an electrode formed on a region of the p-type semiconductor layer where the second n-type semiconductor layer is not formed, so as to bridge over at least the implant portion and to be in contact with both of the p-type semiconductor layer of the active region and the p-type semiconductor layer of the non-active region; and an element isolating film provided to electrically isolate at least the n⁺-type semiconductor layer of each of the plurality of semiconductor elements from others.

11. The semiconductor device as set forth in claim 10, wherein the electrode of each of the plurality of semiconductor elements has a narrowed portion in a plane view, an entire length of the narrowed portion being formed on the implant portion.

12. The semiconductor device as set forth in claim 10, wherein the material having the first band gap of the p-type semiconductor layer of each of the plurality of semiconductor elements is constituted mainly of gallium arsenide (GaAs).

13. The semiconductor device as set forth in claim 10, wherein the material having the first band gap of the p-type semiconductor layer of each of the plurality of semiconductor elements is constituted mainly of gallium arsenide antimonide (GaAsSb).

14. The semiconductor device as set forth in claim 10, wherein the material having the second band gap of the second n-type semiconductor layer of each of the plurality of semiconductor elements is constituted mainly of indium gallium phosphide (InGaP).

15. The semiconductor device as set forth in claim 10, wherein the electrode of each of the plurality of semiconductor elements is formed to extend to an opposite side from the implant portion with the second n-type semiconductor layer, and has a signal input connection part accepting the RF signal on the opposite side.

16. The semiconductor device as set forth in claim 10, wherein the implant portion has ions of one kind, or two kinds or more selected from a group consisting of a boron ion, an oxygen ion, a hydrogen ion, and a helium ion.

17. The semiconductor device as set forth in claim 10,
wherein the first n-type semiconductor layer of each of the plurality of semiconductor elements is formed on a part of the n$^+$-type semiconductor layer, and
wherein each of the plurality of semiconductor elements further comprises a second electrode formed on a region of the n$^+$-type semiconductor layer where the first n-type semiconductor layer is not formed.

18. The semiconductor device as set forth in claim 10,
wherein each of the plurality of semiconductor elements further comprises a third n-type semiconductor layer formed on the second n-type semiconductor layer and having a higher impurity concentration than an impurity concentration in the second n-type semiconductor layer.

19. The semiconductor device as set forth in claim 15, further comprising:
a plurality of capacitors each having one end connected to the signal input connection part of each of the plurality of semiconductor elements; and
a wire provided to connect other ends of the plurality of capacitors with each other.

20. The semiconductor device as set forth in claim 10,
wherein each of the plurality of semiconductor elements comprises a direct current input electrode accepting the DC voltage on the p-type semiconductor layer of the non-active region, and
further comprising a wire provided to connect the direct current input electrodes of the plurality of semiconductor elements with each other.

* * * * *